US006762380B2

(12) United States Patent
Nelson et al.

(10) Patent No.: US 6,762,380 B2
(45) Date of Patent: Jul. 13, 2004

(54) MEMBRANE SWITCH CIRCUIT LAYOUT AND METHOD FOR MANUFACTURING

(75) Inventors: Wayne Nelson, Zimmerman, MN (US); Joel Theisen, Maple Grove, MN (US); John Pesonen, Plymouth, MN (US)

(73) Assignee: Icorp, Minneapolis, MN (US)

( * ) Notice: Subject to any disclaimer, the term of this patent is extended or adjusted under 35 U.S.C. 154(b) by 135 days.

(21) Appl. No.: 09/895,933

(22) Filed: Jun. 29, 2001

(65) Prior Publication Data

US 2003/0000820 A1 Jan. 2, 2003

(51) Int. Cl.[7] ............................ H01H 9/00; H05K 1/11

(52) U.S. Cl. ....................... 200/512; 174/250; 200/292; 361/803

(58) Field of Search ................................ 200/5 R, 5 A, 200/292, 512–517, 511; 361/748–812; 174/250–268

(56) References Cited

U.S. PATENT DOCUMENTS

| | | | | | |
|---|---|---|---|---|---|
| 3,680,037 A | * | 7/1972 | Nellis et al. | 200/511 X |
| 3,886,335 A | * | 5/1975 | Hendricks | 200/517 |
| 4,024,629 A | | 5/1977 | Lemonie et al. | 29/625 |
| 4,035,593 A | * | 7/1977 | Riniker | 200/5 A |
| 4,046,975 A | * | 9/1977 | Seeger, Jr. | 200/515 |
| 4,066,851 A | * | 1/1978 | White et al. | 200/5 A |
| 4,128,744 A | * | 12/1978 | Seeger | 200/5 A |
| 4,301,192 A | | 11/1981 | Plichta et al. | 427/97 |
| 4,795,861 A | * | 1/1989 | O'Rourke | 200/5 A |
| 4,845,839 A | | 7/1989 | Brown | 29/620 |
| 4,857,683 A | * | 8/1989 | Maser | 200/5 A |
| 5,072,077 A | | 12/1991 | Klein | 200/5 A |
| 5,080,929 A | | 1/1992 | Zachman et al. | 427/97 |
| 5,228,562 A | | 7/1993 | Burk | 200/512 |
| 5,314,711 A | | 5/1994 | Baccini | 427/97 |
| 5,356,658 A | | 10/1994 | Hertz et al. | 427/96 |
| 5,438,177 A | | 8/1995 | Fagan | 200/517 |
| 6,046,417 A | | 4/2000 | Menze | 200/330 |

* cited by examiner

*Primary Examiner*—James R. Scott
(74) *Attorney, Agent, or Firm*—Fredrikson & Byron, P.A.

(57) ABSTRACT

A membrane switch circuit layout and method for producing a membrane switch circuit layout are disclosed. The membrane switch circuit layout may have two or more membrane layers. Each membrane has a top surface and a bottom surface. A conductive circuit trace is printed on the top surface of each membrane. The membrane layers are placed in a stack with each top membrane having thru-holes selectively cut there through. Thus, for example, in a layout having two membrane layers, the first membrane is positioned beneath the second membrane and the second membrane has thru-holes cut there through. Conductive ink may be pressed through the thru-holes to provide electrical connection between the circuit traces printed on the membrane layers. An adhesive may be placed between the membrane layers as either adhesive printed on one of the membrane layers or as an additional layer.

26 Claims, 5 Drawing Sheets

MEMBRANE SWITCH CIRCUIT LAYOUT AND METHOD FOR MANUFACTURING

FIELD OF THE INVENTION

This invention relates to membrane switch circuit layouts and the method of manufacturing such. Specifically, it relates to membrane switch circuit layouts having multiple insulated membrane layers each having electrical circuit paths printed thereon. The invention provides electrical connection is desired at discrete positions between the circuit paths on different membrane layers.

BACKGROUND OF THE INVENTION

The manufacture of membrane switch circuit layouts having thru-holes is presently performed with a screen-printing process. One method of screen-printing generally provides printing a membrane with an electrical circuit path on both its top and bottom surface. Thru-holes are selectively cut through the membrane where electrical connection is desired between the circuit path printed on the top surface and the circuit path printed on the bottom surface. Normally, the membrane is then placed with its bottom surface on a blotting paper or support paper. Conductive ink is pressed through the thru-holes from the top surface to the bottom surface. If a blotting or support paper is not used, excess ink must be wiped from the surface beneath the membrane. If a blotting or support paper is used, the paper must be replaced before the next step. The membrane is then turned over and placed with its top surface on a blotting or support paper. Conductive ink is pressed through the thru-holes from the bottom surface to the top surface to ensure complete filling of the holes. If a blotting or support paper is not used, excess ink must again be wiped from the surface beneath the membrane. This process is labor intensive and costly.

An additional concern with the current printing process is that the excess ink may spread out along the bottom or top surface of the membrane once the ink is pressed through the thru-hole. This causes a sloppy connection and may spread over multiple paths of the circuit trace on the bottom surface. In such a case, the entire membrane switch circuit must be reproduced.

Another problem with this process method for membrane switch circuit layouts is that the electrical connection between the circuits paths on the various surfaces may deteriorate. Deterioration results because there is no support of the conductive ink filled hole. Bending, pressure, or normal wear may result in the ink flaking from the hole and deteriorating the electrical connection.

Alternately, membrane switch circuit layouts may be printed using a dielectric or insulating layer between layers of circuit traces printed on one side of a membrane. That method involves printing a first conductive trace on a surface of the membrane; selectively printing a dielectric or insulating layer, a non-conductive ink, over the first conductive trace, leaving open areas where electrical conduction is desired between conductive traces; and printing a second conductive trace over the dielectric or insulating layer. Printing of the dielectric or insulating layer requires two printing passes to ensure no "pinhole" gaps. Any pinhole in the dielectric or insulating layer may result in a shorted circuit. Further, under high humidity conditions, the dielectric or insulating layer absorbs moisture that provides an undesirable path for silver migration through the dielectric or insulating layer. Silver migration results in a high resistance short in the circuit.

Due, at least, to the two printing passes, this method is labor and cost intensive. The resulting membrane switch circuit similarly suffers from possible degradation of the traces. In particular, there is concern that the dielectric or insulating layer will deteriorate through bending, pressure, or normal wear. This would cause open communication between the two traces. It is similarly possible that the second conductive trace would deteriorate and cause a lack of electrical conductivity along the path desired.

SUMMARY OF THE INVENTION

To address the difficulties noted above, it is an object of this invention to provide a membrane switch circuit layout without the shortcomings of those in the current art and a more cost-effective method for manufacturing membrane switch circuit layouts. While reference is made explicitly to two membrane circuit layers, it should be apparent to those skilled in the art that the circuit may be manufactured of any number of membrane layers. The membrane switch circuit layout and method for producing such of the current invention eliminates the shortcomings of the prior art and provides a cost-effect method for producing the membrane switch circuit.

In a particularly preferred embodiment of the present invention, the membrane switch circuit comprises two membrane layers, a first membrane layer and second membrane layer. Each membrane layer is printed with a circuit trace. The second membrane layer has thru-holes selectively cut there through to provide electrical connection between the circuit trace on the first membrane layer and the circuit trace on the second membrane layer at discrete points. The second membrane layer is positioned over the first membrane layer and conductive ink is pressed through the thru-holes. Pads may be printed on the first membrane layer for receiving the conductive ink. Gravity forces the ink through the hole to contact the bottom layer. The spread of the ink is constrained to the size of the hole and there is little risk of the ink spreading along the bottom layer as it is blocked by the contact of the two membrane layers with one another. A viscous ink is preferred to enable the ink to completely fill the hole.

The first membrane layer, positioned beneath the second membrane layer, may provide support for the conductive ink. This prevents the need for use of blotting or support paper during the printing process. It decreases the printing process from two steps to one step as the hole is completely filled in one step rather than requiring flipping of the membrane layer and filling from the opposite surface. Additionally, the support provided by the first membrane layer demonstrably decreases the deterioration of the electrical connection between circuit paths provided by the conductive ink.

The second membrane layer additionally provides insulation between the conductive traces at all locations other than those where thru-holes have been selectively cut. This eliminates the necessity of an additional insulating layer for use when intersecting traces (e.g., crossovers) are not intended to be inter-conductive.

The invention may be further understood from the following more detailed description taken with the accompanying drawings.

DETAILED DESCRIPTION

It will be understood that the drawings are intended to teach a preferred embodiment of the present invention but are not intended to limit the invention thereto.

Figure 1A:
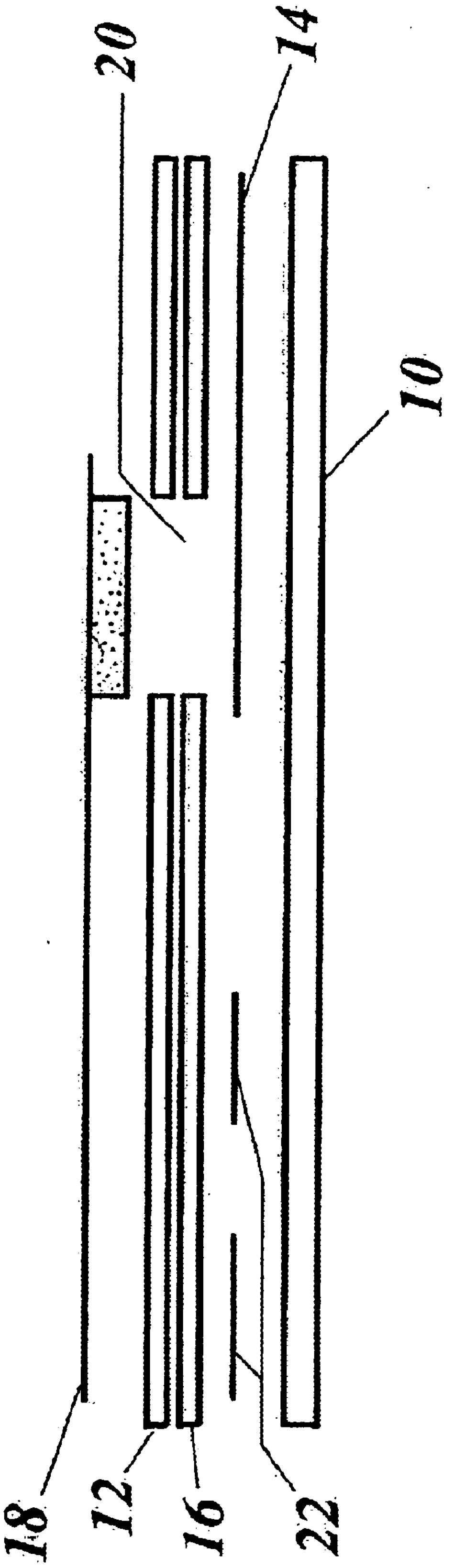
FIG. 1A is an exploded side perspective view of a preferred embodiment of the membrane switch circuit layout.
Figure 1B:
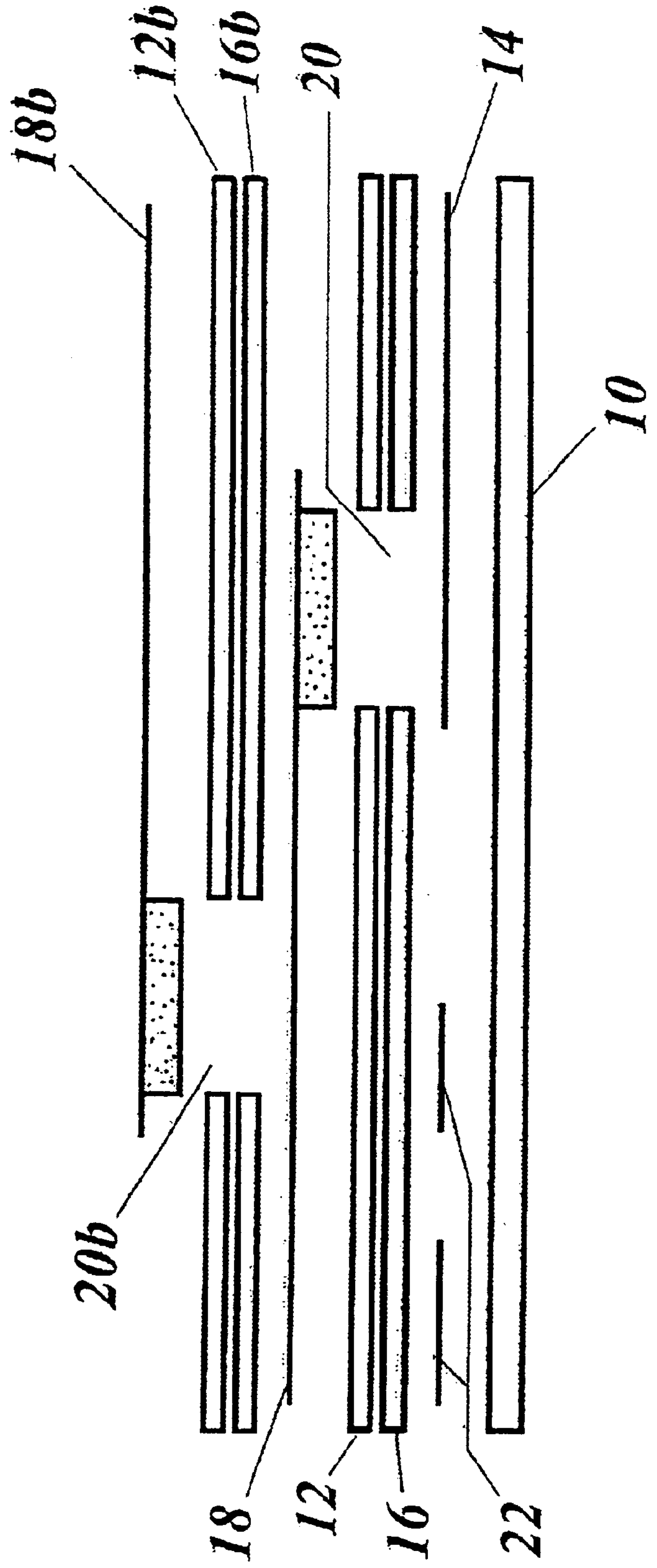
FIG. 1*b* is an exploded view of a side perspective view of a further embodiment of the membrane switch circuit layout.
Figure 2A:
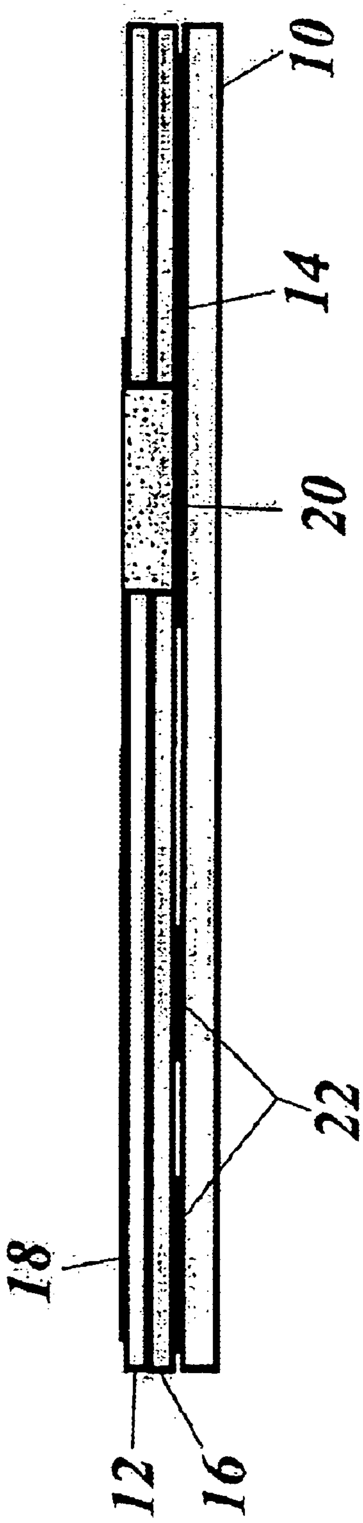
FIG. 2A is a side perspective view of a preferred embodiment of the membrane switch circuit layout.

Referring now to FIGS. 1 and 2, there is depicted a side view a membrane switch circuit layout. FIG. 1 particularly shows an exploded view of the layers of the membrane switch circuit layout. First and second membrane layers 10 and 12 respectively comprise the main structure of the circuit. The membrane layers 10 and 12 are 0.001–0.007 inches thick in a preferred embodiment. However, any thickness suitable to support conductive ink traces and provide insulation and/or thru-holes there between may be used.

The first membrane layer 10 is the support layer for the circuit. A circuit path 14 is printed on the first membrane layer 10. The circuit path may be printed with suitable conductive ink as is known in the art. An adhesive 16 is positioned over first membrane layer 10. As shown in this embodiment, the adhesive 16 may be an adhesive layer selectively cut for openings. The adhesive 16 may be a pressure sensitive adhesive or heat sensitive adhesive applied to the bottom surface of the second membrane layer 12 or the top surface of the first membrane layer 10 and selectively cut for openings. The adhesive 16 may alternatively be a printable adhesive selectively printed for openings on the top surface of the first membrane layer 10 or the bottom surface of the second membrane layer 12.

A circuit path 18 is printed on the second membrane layer 12. The second membrane layer 12 is selectively cut with thru-holes 20 to allow electrical connection between the first membrane circuit path 14 and the second membrane circuit path 18. The thru-holes 20 are intended to provide electrical connection between the first and second membrane circuit paths 14 and 18 only at selected discrete locations.

The first membrane circuit path traces at other locations, for example 22, are insulated from second membrane circuit path traces, for example 24. The second membrane layer 12 insulates the first membrane circuit path traces 22 from the second membrane circuit path traces, for example 24. The thru-hole 20 is press filled with conductive ink 26 to complete the electrical connection. Although conductive ink is particularly preferred, any other electrically conductive medium may be used to fill the thru-hole 20.

Figure 3:
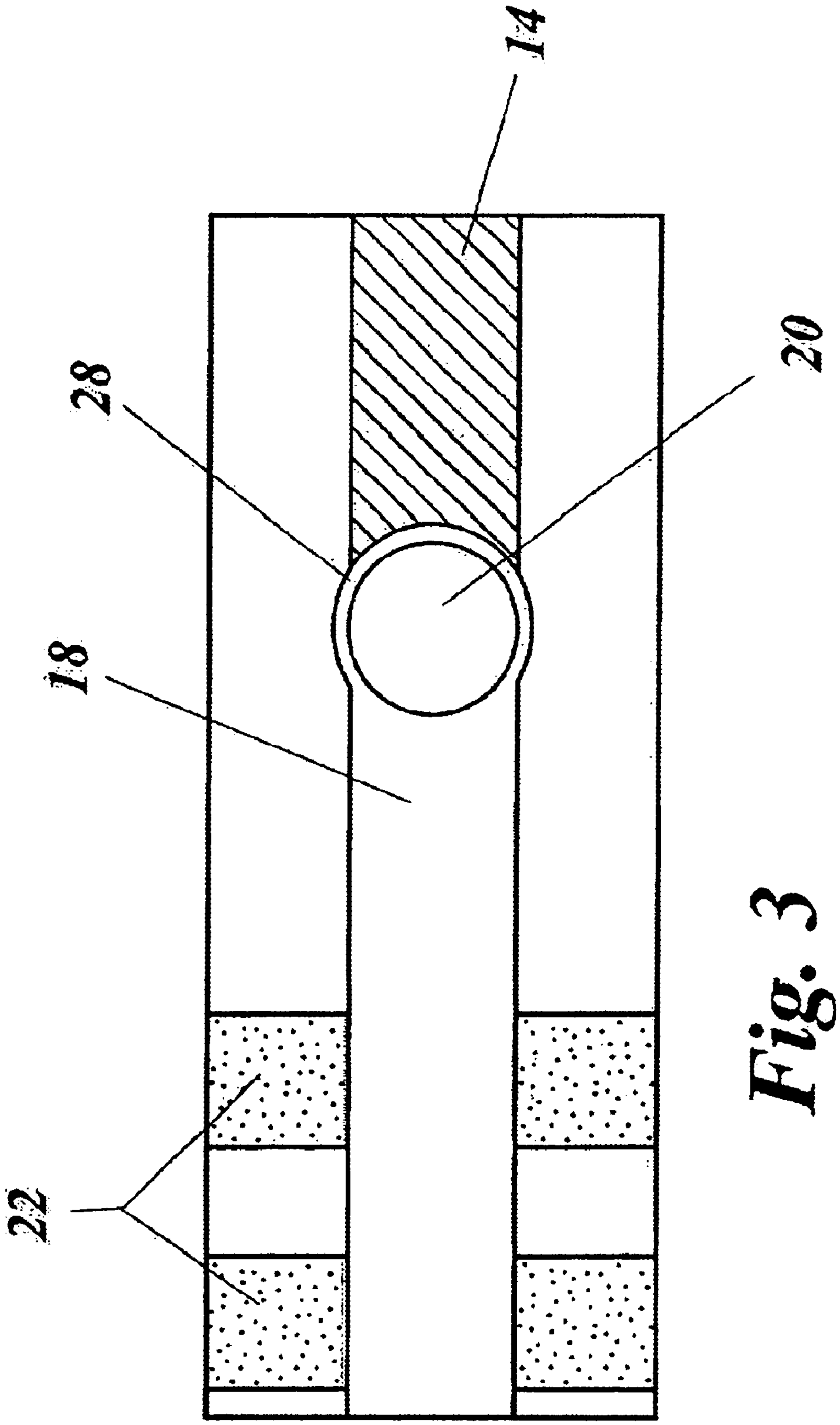
FIG. 3 is a top perspective view of a preferred embodiment of the membrane switch circuit layout.

FIG. 3 shows a top perspective view of a preferred embodiment of the membrane switch circuit layout. First and second membrane circuit paths, 14 and 18 respectively, are electrically connected at the location of thru-hole 20. A pad 28 for receiving conductive ink is printed on first membrane 10 corresponding to the location of the thru-hole 20 in second membrane 12. First membrane circuit path traces 22 are insulated from second membrane circuit path traces 18 by second membrane 12.

A particular embodiment of the present membrane switch circuit layout may be manufactured as follows. The top surface of first membrane 10 is printed with a conductive circuit trace 14. An adhesive is positioned between first and second membrane layers, 10 and 12 respectively. The adhesive 16 may be a pressure sensitive adhesive or heat sensitive adhesive applied to the bottom surface of the second membrane layer 12 or the top surface of the first membrane layer 10 and selectively cut for openings. The adhesive 16 may alternatively be a printable adhesive selectively printed for openings on the top surface of the first membrane layer 10 or the bottom surface of the second membrane layer 12. The second membrane 12 having thru-holes 20 selectively cut there through and located to connect the first membrane circuit trace 14 with a second membrane circuit trace 18, is positioned over the first membrane layer 10. The top surface of second membrane layer 12 is printed with the conductive circuit trace 18 and the thru-holes 20 are press-filled with conductive ink. This completes the electrical connection of the first membrane circuit trace 14 and the second membrane circuit trace 18.

Figure 2B:
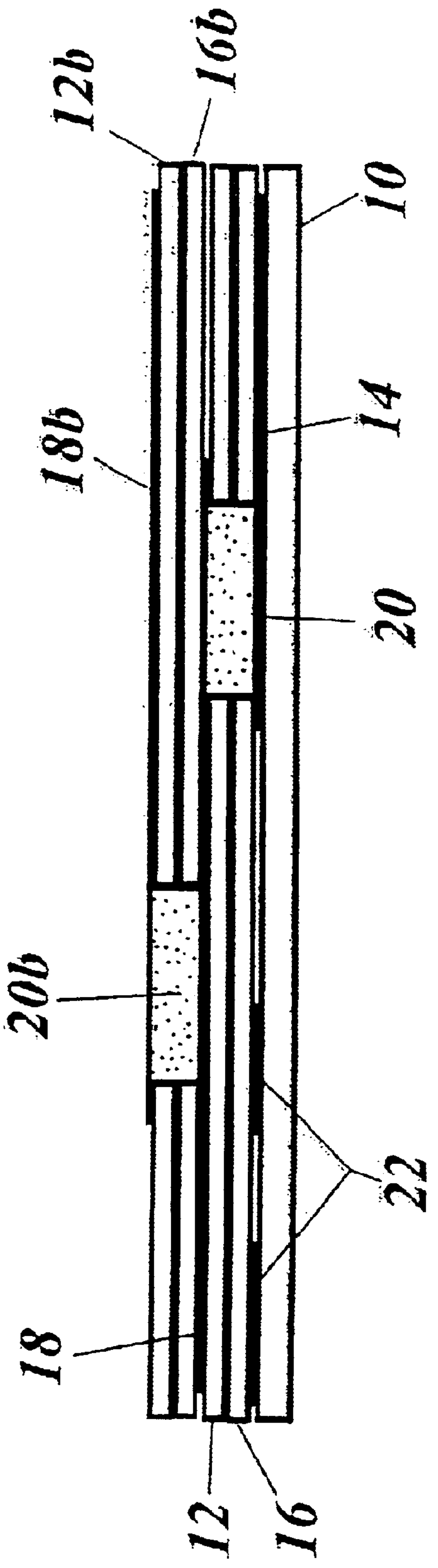
FIG. 2*b* is a side perspective view of the embodiment of the membrane switch circuit layout shown in FIG. 1*b*.

As should be obvious to one skilled in the art, it is possible to use the same method of positioning multiple membrane layers over one another with thru-holes through top membrane layers providing electrical connection between different circuit paths to manufacture a membrane switch circuit layout comprising more than two membrane layers. That is, as shown in FIGS. 1*b* and 2*b*, a three membrane layer membrane switch circuit layout example, is manufactured as follows; The top surface of a first membrane layer 10 is printed with a first conductive circuit trace 14. A first adhesive 16 is positioned between the first and second membrane layers 10 and 12. The second membrane layer 12 is printed with a second conductive circuit trace 18 and has thru-holes 20 selectively cut there through and located to connect the first membrane circuit trace 14 with the second membrane circuit trace 18. The thru-holes 20 are press-filled with conductive ink. A second adhesive 16*b* is positioned between the second and third membrane layers 12 and 12*b*. The third membrane layer 12*b* is printed with a third conductive circuit trace 18*b* and has thru-holes 20*b* selectively cut there through and located to connect the second membrane circuit trace 18 with the third membrane circuit trace 18*b*. The thru-holes 20*b* are press-filled with conductive ink. Thus, for each additional membrane layer, an additional adhesive is applied between the topmost layer and the additional layer, the additional layer is printed with a membrane circuit trace, and the thru-holes are press-filled with conductive ink.

While particular embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as encompassed by the scope of the appended claims.

What is claimed is:

1. A membrane switch circuit layout comprising two or more non-conductive membrane layers, each membrane layer having top and bottom surfaces, a conductive circuit trace printed on the top surface of each membrane layer, the first membrane layer being positioned beneath the second membrane layer, the second membrane layer having thru-holes selectively cut there through and positioned to provide electrical connection between circuit traces printed on the membrane layers, pads for receiving conductive ink being printed on the first membrane layer corresponding to the location of the thru-holes in the second membrane layer.

2. The circuit layout of claim 1 wherein the thru-holes connect the conductive circuit trace printed on the second membrane with the conductive circuit trace printed on the first membrane.

3. The circuit layout of claim 1 wherein conductive ink at least partially fills the thru-holes.

4. The circuit of claim 1 wherein the membranes are electrically insulating.

5. The circuit of claim 4 wherein the adhesive is selectively printed for openings on the top surface of the first membrane layer.

6. The circuit of claim 4 wherein the adhesive is selectively printed for openings on the bottom surface of the second membrane layer.

7. The circuit of claim 4 wherein the adhesive is an adhesive layer positioned between first and second membrane layers, the adhesive layer having openings selectively cut there through.

8. The circuit of claim 1 wherein the second membrane electrically insulates traces printed on its top surface from traces printed on the first membrane.

9. The circuit of claim 1 wherein the first membrane layer is a film layer between 0.001 and 0.007 inches thick.

10. The circuit of claim 1 wherein the second membrane layer is a film layer between 0.001 and 0.007 inches thick.

11. A membrane switch circuit layout comprising three non-conductive membrane layers, each membrane layer having top and bottom surfaces, a conductive circuit trace printed on the top surface of each membrane layer, the first membrane layer being positioned beneath the second membrane layer and the second membrane layer being positioned beneath the third membrane layer, the second and third membrane layer having thru-holes selectively cut there through and positioned to provide electrical connection between circuit traces printed on the membrane layers.

12. The circuit layout of claim 11, further comprising an adhesive positioned between second and third membrane layers.

13. The circuit layout of claim 11, further comprising an adhesive positioned between first and second membrane layers.

14. The circuit layout of claim 11, further comprising a first adhesive positioned between first and second membrane layers and a second adhesive positioned between second and third membrane layers.

15. The circuit layout of claim 11, wherein the first and second adhesives are selectively printed for openings on the bottom surface of the second and third membrane layers, respectively.

16. The circuit layout of claim 11, wherein the adhesive first and second adhesives are adhesive layers positioned between first and second membrane layers and the second and third membrane layers, respectively, the adhesive layers having openings selectively cut there through.

17. The circuit layout of claim 11, wherein the thru-holes in the second membrane layer connect the conductive circuit trace printed on the second membrane layer with the conductive circuit trace printed on the first membrane layer.

18. The circuit layout of claim 11, wherein the thru-holes in the third membrane layer connect the conductive circuit trace printed on the third membrane layer with the conductive circuit trace printed on the first membrane layer.

19. The circuit layout of claim 11, wherein the thru-holes in the third membrane layer and the thru-holes in the second membrane layer connect the conductive circuit trace printed on the third membrane layer with the conductive circuit trace printed on the first membrane layer.

20. The circuit layout of claim 11, wherein conductive ink at least partially fills the thru-holes.

21. The circuit layout of claim 11, wherein the membrane layers are electrically insulating.

22. The circuit layout of claim 11, wherein the second membrane layer electrically insulates traces printed on its top surface from traces printed on the first membrane layer and the third membrane layer electrically insulates traces printed on its top surface from traces printed on the second membrane layer.

23. The circuit layout of claim 11, wherein pads for receiving conductive ink are printed on the first membrane layer corresponding to the location of the thru-holes in the second membrane layer and pads for receiving conductive ink are printed on the second membrane layer corresponding to the location of the thru-holes in the third membrane layer.

24. The circuit layout of claim 11, wherein the first membrane layer is a film layer between 0.001 and 0.007 inches thick.

25. The circuit layout of claim 11, wherein the second membrane layer is a film layer between 0.001 and 0.007 inches thick.

26. The circuit layout of claim 11, wherein the third membrane layer is a film layer between 0.001 and 0.007 inches thick.

* * * * *